United States Patent
Moench et al.

(10) Patent No.: US 8,345,719 B2
(45) Date of Patent: Jan. 1, 2013

(54) WAVELENGTH-CONTROLLED SEMICONDUCTOR LASER DEVICE

(75) Inventors: Holger M. Moench, Vaals (NL); Philipp Gerlach, Blaustein (DE); Mark Carpaij, MJ's-Hertogenbosch (NL); Alexander M. Van Der Lee, Venlo (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 112 days.

(21) Appl. No.: 13/119,016

(22) PCT Filed: Sep. 16, 2009

(86) PCT No.: PCT/IB2009/054044
§ 371 (c)(1),
(2), (4) Date: Mar. 15, 2011

(87) PCT Pub. No.: WO2010/032202
PCT Pub. Date: Mar. 25, 2010

(65) Prior Publication Data
US 2011/0164633 A1   Jul. 7, 2011

(30) Foreign Application Priority Data
Sep. 17, 2008 (EP) ................ 08164490

(51) Int. Cl.
*H01S 3/13* (2006.01)

(52) U.S. Cl. ............ 372/32; 372/29.02; 372/46.013; 372/29.011; 372/50.21; 372/50.1

(58) Field of Classification Search .......... 372/32, 372/29.02, 46.013, 29.011, 50.21, 50.1
See application file for complete search history.

(56) References Cited

U.S. PATENT DOCUMENTS

| | | | |
|---|---|---|---|
| 6,233,045 B1 * | 5/2001 | Suni et al. | 356/28.5 |
| 6,570,459 B1 | 5/2003 | Nathanson et al. | |
| 7,283,214 B2 | 10/2007 | Xu et al. | |
| 2002/0090011 A1 | 7/2002 | Pezeshki et al. | |
| 2004/0008748 A1 * | 1/2004 | Harker | 372/50 |
| 2006/0013273 A1 * | 1/2006 | Menon et al. | 372/32 |
| 2006/0022213 A1 | 2/2006 | Posamentier | |
| 2006/0182441 A1 * | 8/2006 | Kish et al. | 398/33 |
| 2007/0139128 A1 | 6/2007 | Koyama | |
| 2007/0146085 A1 | 6/2007 | Koyama | |
| 2008/0031294 A1 * | 2/2008 | Krishnamoorthy et al. | 372/34 |
| 2008/0205469 A1 | 8/2008 | Imai et al. | |

FOREIGN PATENT DOCUMENTS

| | | |
|---|---|---|
| DE | 19839088 A1 | 3/2000 |
| WO | 2005099421 A2 | 10/2005 |
| WO | 2010029484 A1 | 3/2010 |

OTHER PUBLICATIONS

Raoul et al., "A Double-Laser Diode Onboard Sensor for Velocity Measurements", 2004, pp. 95-101, vol. 53, No. 1.
Li et al., "Vertical-Cavity Surface-Emitting Laser Devices", 2003, pp. 67-73, Berlin.
Weigl et al., "High-performance oxide-confined GaAs VCSELs", 1997, pp. 409-415, vol. 3, No. 2.

* cited by examiner

*Primary Examiner* — Kinam Park
(74) *Attorney, Agent, or Firm* — Mark L. Beloborodov

(57) ABSTRACT

A semiconductor laser device comprising a laser diode with an integrated photodiode, wherein one of the components of the laser diode with the integrated photodiode is also used for heating the laser diode. A simpler design of a wavelength-controlled semiconductor laser is thus obtained.

12 Claims, 4 Drawing Sheets

WAVELENGTH-CONTROLLED SEMICONDUCTOR LASER DEVICE

FIELD OF THE INVENTION

The invention generally relates to the field of optical gauging devices and more specifically to optical self-mixing sensors.

BACKGROUND OF THE INVENTION

VCSELs with integrated Photodiodes (VIPs) will be key components in automotive sensors for e.g. speed over ground measurements. Automotive applications require a wide temperature range for device operation (e.g. −40° C. ... 120° C.). However, VIPs change their properties significantly over this wide range, if they operate at all.

The dependency of characteristic VCSEL performance parameters on temperature is well known in the literature (e.g. H. Li and K. Iga, "Vertical-Cavity Surface-Emitting Laser Devices", S69ff, Springer 2003). Three major effects can be identified:

The cavity resonance shifts with the temperature in accordance with the relation:

$$\partial \lambda_{res}/\partial T \approx 0.07 \text{ nm/K}$$

Furthermore, the gain peak shifts in accordance with the relation:

$$\partial \lambda_{gain}/\partial T \approx 0.32 \text{ nm/K}$$

Additional effects are a change of the laser threshold and a decrease of the gain/current with increasing temperature.

A proper design allows operation of the VCSEL through a wide range of temperatures (e.g. −80° C. ... 180° C. in B. Weigl et al., "High-performance oxide-confined GaAs VCSELs", IEEE J. Sel. Top. Quantum Electron. 3, 409-415 (1997)).

However, the output power of such a device varies by more than a factor of 10 within the temperature range of operation, and the lasing wavelength is shifted by about 10 nm. In principle, the performance of the integrated photodiode (sensitivity and noise) also varies strongly with temperature. All of these effects are in conflict with the aim of stable VIP performance such as constant signal to noise, constant output power, which should preferably remain below the eye-safe limit and a well-defined wavelength. A 10 nm shift already causes a 1% systematic error in distance and velocity measurements if the laser is used as a self-mixing sensor.

The temperature-dependent wavelength shift of VCSELS has been employed to adjust the wavelengths of laser arrays for DWDMs. US 2008/0031294 A1 discloses a VCSEL array with individual wavelength adjustment of the VCSELs. The wavelength adjustment is achieved by bias heating. The array is mounted on a cooled surface. The wavelength is then individually set by heating elements in proximity with the VCSELs. However, the arrangement requires additional components near the VCSEL to achieve wavelength adjustment. Furthermore, the bias heating according to US 2008/0031294 A1 requires a cooled surface. Although the VCSELs are not cooled individually, the cooling requires additional components for heat dissipation.

OBJECT AND SUMMARY OF THE INVENTION

It is therefore an object of the invention to provide a simpler design of a wavelength-controlled semiconductor laser. This object is achieved by a laser device as defined in claim 1.

Advantageous embodiments and refinements of the invention are defined in the dependent claims. As a general idea, a laser device is proposed wherein one of the components of a laser diode with integrated photodiode is also used for heating the laser diode.

Specifically, a semiconductor laser device is proposed, comprising
a laser diode device with
a semiconductor laser diode,
an integrated photodiode and
electric contacts, typically deposited metal layers, for electrically connecting the semiconductor laser diode and the integrated photodiode.

Accordingly, a semiconductor laser device such as in particular a VCSEL with integrated photodiode is proposed, comprising integrated heating means. The invention is particularly suitable for stabilizing the laser wavelength through a wide range of operating temperatures. A basic idea of this invention is to employ a heating element which is an integrated part of the laser diode device such as a VIP. In other words, besides its normal function, one of the elements of a laser diode with integrated photodiode is also used as a controlled heating element. Consequently, no separate heater is necessary. Accordingly, at least one of the existing structures including the electric contacts of the laser diode device serves as heating element.

The semiconductor laser device further comprises feedback control circuitry for setting or stabilizing the laser wavelength by stabilizing or setting the temperature of the laser diode device. This circuitry is set up to generate a heating voltage or current in response to a measured temperature-dependent parameter. The heating voltage or current is applied to at least one electric contact of the laser diode device. A least one of the electric contacts also electrically connects the semiconductor laser diode or the integrated photodiode so that a heating current flows through the laser diode device and heats the semiconductor laser diode. Generally, the feedback control circuitry comprises a feedback loop in which the measured temperature-dependent parameter is fed back from the laser diode device to the control circuitry.

The semiconductor laser diode is preferably a vertical cavity surface emitting laser (VCSEL) with a vertically integrated photodiode (VIP). The VCSEL structure facilitates the integration of a photodiode. The lower power consumption and hence the lower heat emission enlarges the range of temperature adjustment.

According to one embodiment of the invention, the integrated photodiode is operated at reverse bias, and the feedback control circuitry for stabilizing or setting the temperature of the laser diode device is set up to set the voltage across the integrated photodiode which is thereby heated by the photocurrent induced by the received light.

In this case, no additional heating element is required and a common laser diode with integrated photodiode such as a VIP may be employed together with the feedback control circuitry.

According to a further embodiment, at least one of the electric contacts for electrically connecting the semiconductor laser diode and the integrated photodiode has two terminal points or electrodes connecting to the circuitry for stabilizing or setting the laser wavelength. In this case, the heating current controlled by the circuitry flows laterally through the electric contact between the two terminal points. A further possibility is to partially conduct the heating current through the substrate or layer underneath the respective electric contact. Accordingly, instead of using an electric contact with two terminal points, the electric contact may also be split into two laterally separated contacts. The heating current or voltage is thus fed between two separated electric contacts on a common surface, at least one of the electric contacts contacting the semiconductor laser diode or the integrated photodiode. To increase the resistance of this type of heating element, the separate electric contacts can be produced from different materials. Specifically, while one contact may be a standard alloyed contact, the other one may be a simple metal contact causing additional high losses and thereby increasing the overall resistance comprising the contact resistance and sheet resistance.

Heating by the photocurrent and the voltage across the photodiode and via one or more electric contacts designed as a heating element can also be combined.

The temperature of the laser diode may be sensed with a suitable temperature sensor. However, it is possible and advantageous to monitor the operating temperature of the laser diode without the need for an extra temperature sensor. In particular, the relevant temperature of the active zone can be measured directly. For this purpose, the dependency of the laser diode forward voltage (operating voltage) on temperature can be gauged. Typically, this dependency is negative.

According to this embodiment of the invention, the input of the feedback control circuitry is connected to the electric contacts of the semiconductor laser diode, which feedback control circuitry measures the forward voltage of the laser diode as a temperature-dependent input parameter.

To control the laser wavelength according to a refinement of this embodiment, the diode is heated by the feedback control circuitry as long as the operating voltage comes below a predefined value at a fixed operating current if the laser diode temperature is lower than a temperature corresponding to a predetermined wavelength (i.e. the wavelength to be set or stabilized).

Alternatively or additionally, the light output as measured by the integrated photodiode can be used as an input parameter for the feedback control circuitry. According to an advantageous refinement of the invention, the input of the feedback control circuitry is thus connected to the electric contacts of the integrated photodiode, and the light output as measured by the integrated photodiode is fed as an input parameter to the feedback control circuitry which sets the heating current or voltage in dependence upon the light output. Although this parameter is somewhat sensitive to feedback, particularly under lasing conditions, this embodiment also has a very simple design as no additional temperature sensor is required. Furthermore, as already mentioned above, the temperature dependence of the laser intensity is very strong, which allows a highly sensitive temperature measurement.

As a further alternative or additional input parameter, the feedback control circuitry can be set up to use a signal measured on the heating part directly. Particularly a parameter corresponding to the resistance of the part heated by the heating voltage or heating current can be detected. The voltage across the heating part also depends on temperature, particularly due to the temperature-dependent resistance. It may be useful to control the temperature of the heated element rather than the temperature of the laser if the heated part is geometrically separated. In this case, the reaction time of the laser temperature will render the feedback loop rather slow if the temperature is derived from the laser voltage. According to a further refinement of the invention, the voltage across the part of the laser diode device which is heated is thus fed as an input parameter to the feedback control circuitry, and the heating voltage or current is set by the feedback control circuitry in response to this voltage.

To reduce the power needed to heat the laser diode to the desired temperature and simultaneously render the feedback loop faster, it is also advantageous to employ a semiconductor laser diode formed as a mesa structure on a substrate, which mesa structure is at least partly surrounded by a trench in the substrate. The trench reduces the heat dissipation laterally along the substrate.

A further alternative or additional possibility of providing some heat insulation for the laser diode is to arrange a partially oxidized layer between mesa and substrate.

Up to now, laser diodes have generally been cooled so as to optimize their lifetime and efficiency. However, cooling, in particular active cooling requires additional components. If the laser diode is cooled passively, the ambient temperature limits the working temperature. However, depending on the application, the ambient temperature can fluctuate to a great extent. Typical applications in an environment of fluctuating ambient temperatures are sensors for vehicles, in particular automotive, nautical or aviation sensors. As a general idea of the invention, active cooling of laser sensors can be avoided if the laser diode is operated at the high temperature end of applications in the typical range of ambient temperatures. For this purpose, use of a heating element so as to significantly reduce the range of temperatures is proposed, so that the laser diode such as a VIP is always operated at temperatures well above the lower limit of the ambient temperature range that is typical of the application. However, for temperature ranges up to temperatures at which a negative impact on the laser diode lifetime can be expected, it is a preferred possibility to operate the VCSEL at medium temperatures, which still reduces the total span of occurring temperatures by a factor of, e.g., at least 2. In this case, time intervals in which the laser diode is operated at e.g. >100° C. can be shortened while still reducing the temperature range of operation. It is therefore generally preferred to set the operating temperature below the temperature range which is detrimental to the lifetime of the laser diode.

The device can thus be designed to show optimum properties for higher temperatures. More specifically, a vehicle velocity or distance sensor with a semiconductor laser device, in particular a semiconductor laser device as described hereinbefore is proposed, comprising a semiconductor laser diode, self-mixing signal decoding circuitry for measuring a parameter related to the distance or velocity from self-mixing oscillations of the laser intensity, and feedback control circuitry having an input for sensing a temperature-related parameter. The feedback control circuitry controls a heating current or heating voltage which heats the semiconductor laser diode and thereby stabilizes the temperature of the semiconductor laser diode at a value of at least 20°, preferably at least 50°, and more preferably at least 60°. As mentioned above, the temperatures occurring in automotive applications typically range from −40° C. to 120° C. The laser diode is thus operated in the upper 60% of the relevant temperature range.

Due to this operation, no active cooling is required and heating is sufficient to stabilize the laser diode at a fixed, yet comparably high temperature. The invention is particularly suitable for laser self-mixing sensors, as the frequency of the self-mixing oscillations is a function of the laser wavelength.

The temperature range in nautical and aviation applications is generally similar. Depending on the application, the temperature of the laser diode may also be set to be higher or lower. However, the temperature which is stabilized by the feedback control circuitry is preferably below 100° C., more preferably below 80° C. so as to ensure stable operation and a long lifetime.

DESCRIPTION OF EMBODIMENTS

Figure 1:
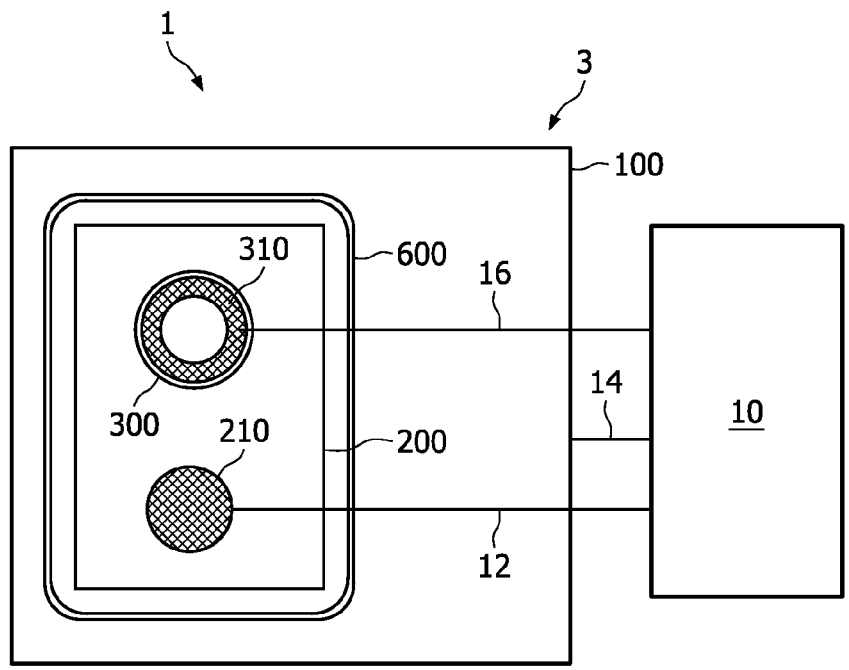
FIGS. 1 and 2 are a top view and a side view, respectively, of a semiconductor laser device according to a first embodiment of the invention.
Figure 2:
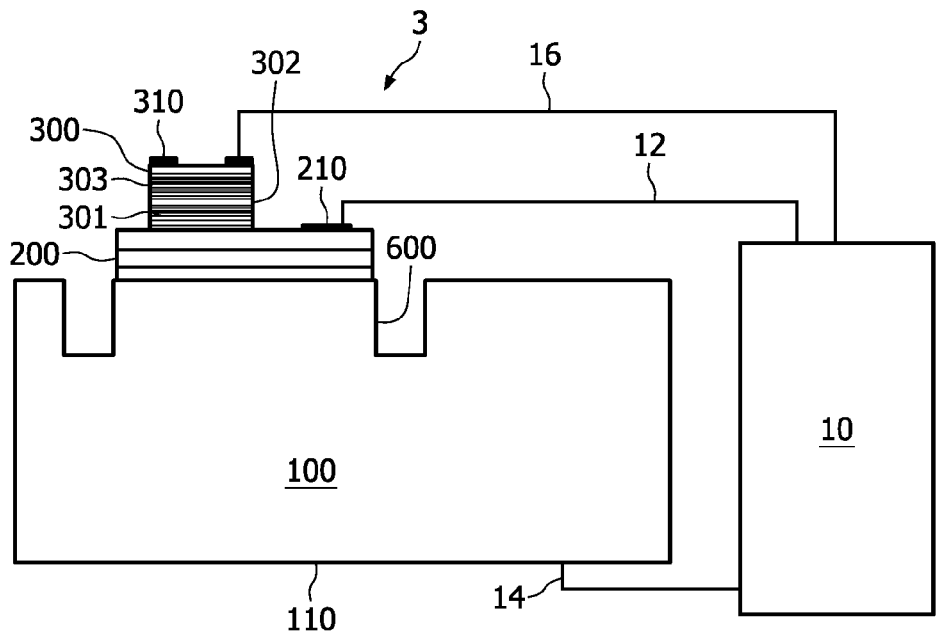

FIGS. 1 and 2 are a schematic top view and a side view, respectively, of a semiconductor laser device 1.

The semiconductor laser device 1 comprises a laser diode device 3 with a VCSEL 300 and an integrated photodiode 200 and electric contacts 110, 210, 310 for electrically connecting the VCSEL 300 and the integrated photodiode 200. The VCSEL 300 comprises two Bragg reflector stacks 301, 303 with an intermediate stack 302 of, e.g. three quantum wells. The layers of the VCSEL and the photodiode are deposited on a substrate 100. A typical substrate material for a VCSEL is GaAs.

The semiconductor laser device 1 further comprises feedback control circuitry 10 for setting or stabilizing the laser wavelength by stabilizing or setting the temperature of the laser diode device 3. The feedback control circuitry 10 is set up to generate a heating voltage or current in response to a temperature-dependent parameter detected by the feedback control circuitry 10. This heating voltage or current is applied to electric contacts of the laser diode device 3. At least one electric contact also electrically connects the VCSEL 300 or the integrated photodiode 200 so that a heating current flows through the laser diode device 3 and heats the VCSEL 300 up to a predetermined temperature associated with a desired wavelength. In particular, the VCSEL 300 is heated by the feedback control circuitry 10 via the photocurrent and the adjusted reverse bias voltage as long as the operating voltage comes below a predefined value at a fixed operating current if the laser diode temperature is lower than a temperature corresponding to the predetermined wavelength.

Specifically, the feedback control circuitry 10 is connected to the laser diode device 3 via lines 12, 14, 16. Lines 12 and 16 are connected to the ring contact 310 on top of the VCSEL 300 and the electric contact 210 which connects the integrated monitoring diode 200 and the VCSEL. Via these lines 12, 16, the feedback control circuitry 10 measures the forward voltage of the VCSEL 300 as a temperature-dependent parameter.

The feedback control circuitry 10 is further connected to rear contact 110 via line 14. Via lines 12 and 14, the integrated photodiode (200) is operated at reverse bias, and the feedback control circuitry 10 adjusts the voltage across the integrated photodiode (200) via lines 12, 14. The photodiode is thereby heated by the photocurrent induced by the received light, and the heating power applied to the integrated photodiode 200 is given by the product of the photocurrent and the voltage applied by the feedback control circuit 10.

As the photocurrent is almost independent of the reverse bias voltage in reverse bias operation, the heating power can be controlled by adjusting the reverse bias voltage without disturbing the measurement of the laser intensity. It is further useful if the photocurrent is also fed back to the feedback control circuitry 10 so that the voltage can be determined to achieve a certain heating power in dependence upon the deviation of actual and desired temperatures of the VCSEL 300.

The integrated photodiode 200 and the VCSEL 300 jointly form a mesa structure which is surrounded by a trench 600 introduced into the substrate 100. The trench 600 provides some thermal separation of the mesa structure. In addition to the etched trench 600, it may be helpful to have a partially oxidized layer between mesa and substrate 100 (similar to the oxide aperture of a VCSEL).

Figure 3:
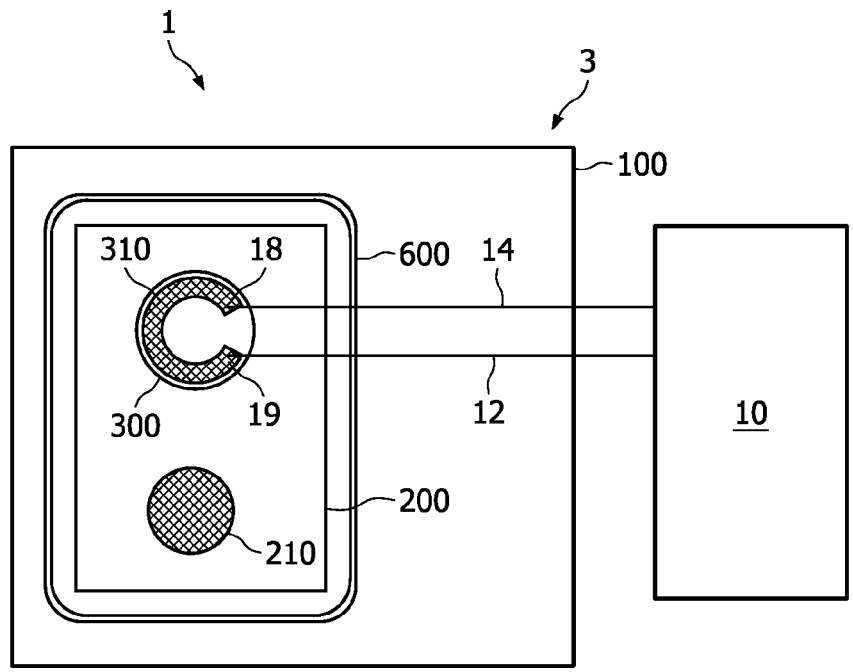
FIG. 3 is a top view of a second embodiment of the invention with a ring contact serving as a heating element.

FIG. 3 shows a further embodiment of a semiconductor laser device 1. This embodiment is based on the recognition that one of the electric contacts 110, 210, 310, which connect the VCSEL 300 and the integrated photodiode 200, is employed as a heating element. For this purpose, the respective electric contact is modified in that two terminal points on the electric contact are used which are connected to the feedback control circuitry 10. The feedback control circuitry 10 then controls a heating current between the two terminal points.

In the embodiment shown in FIG. 3, the ring contact 310 on top of the VCSEL is used as a heating element. The ring-shaped electrically conducting layer is interrupted so that two ends are formed. The ends are used as terminal points 18, 19 at which the feedback control circuitry 10 is connected via lines 12, 14. The heating current controlled by feedback control circuitry 10 thus flows along the ring contact between the terminal points 18, 19.

Moreover, as the conducting material of ring contact 310 has a temperature-dependent resistance, the ring contact 310 may be simultaneously used as a temperature sensor. A suitable parameter used as input for the feedback control may thus be the ratio of current flowing between the terminal points 18, 19 and the potential difference between lines 12, 14.

Figure 4:
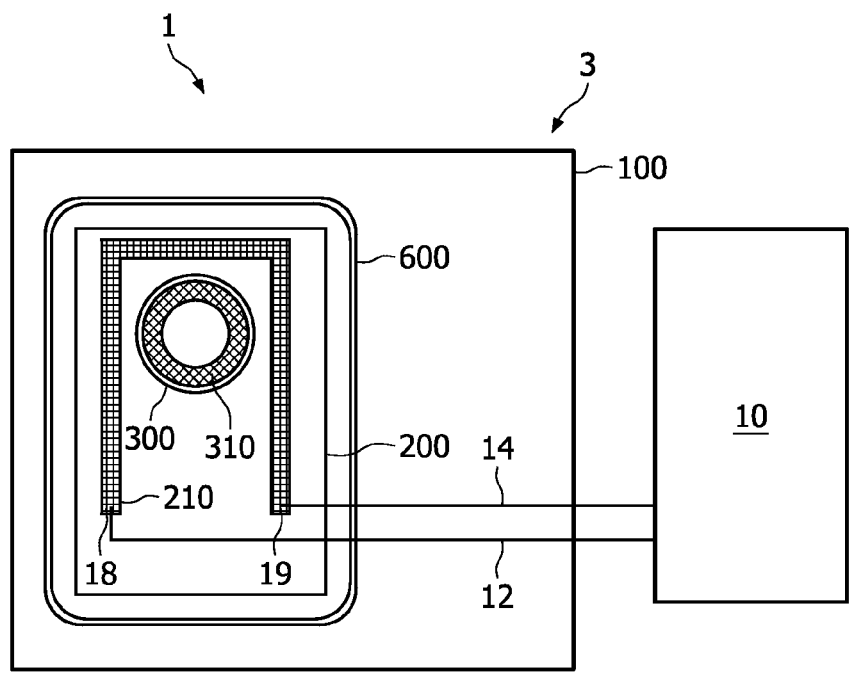
FIGS. 4 and 5 show variants of the embodiment shown in FIG. 3.

FIG. 4 shows a variant of the embodiment shown in FIG. 3. Instead of the ring contact 310 on top of the VCSEL 300, the electric contact 210 on top of integrated photodiode 200, which is preferably the n-contact for the VCSEL 300 and the integrated photodiode 200, is used as a heating element. For this purpose, the contact 210 is formed as an elongated, U-shaped layer extending about the VCSEL 300. The ends of the legs of this U-shaped contact are contacted by lines 12, 14 and thereby constitute the terminal points 18, 19.

Figure 5:
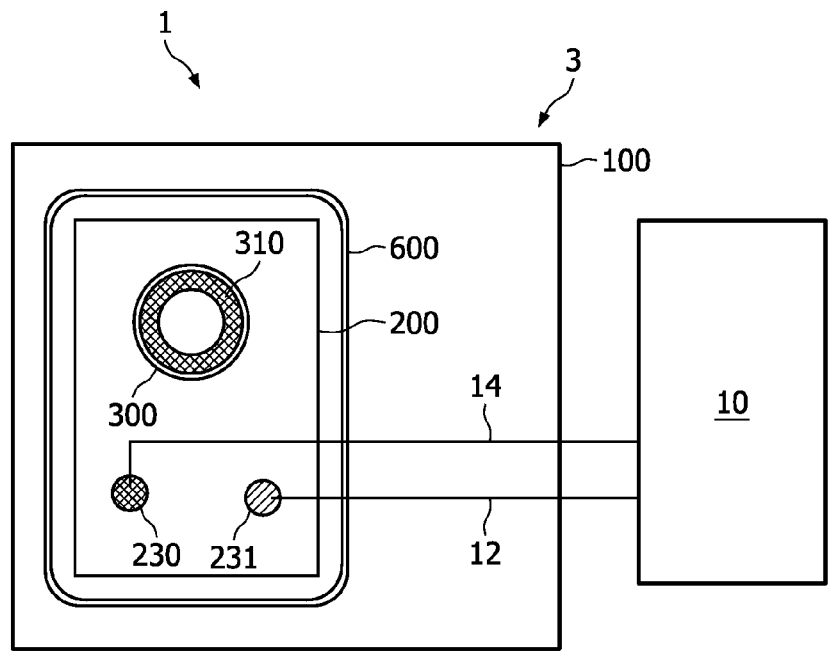

FIG. 5 shows a further variant of an embodiment in which electric contacts are additionally used as heating elements. According to the variant shown in FIG. 5, the heating current or voltage is fed between two laterally separated electric contacts on a common surface, at least one of the electric contacts contacting the VCSEL 300 and/or the integrated photodiode 200. Likewise as in the embodiment shown in FIG. 4, the n-contact which contacts both the VCSEL 300 and the integrated photodiode 200 is modified to serve as a heating element. The n-contact on the integrated photodiode 200 has been split into two separated contacts 230, 231. Either one of the contacts 230, 231 or both contacts may be used to connect to the power supply (not shown) for the VCSEL. A heating voltage controlled by the feedback control circuitry 10 is applied between the contacts 230, 231 via lines 12, 14. The overall heating power results from the sheet resistance between the contacts 230, 231, the contact resistances between the contacts 230, 231 and the underlying layer of the photodiode 200. To enhance the contact resistance, a different metal can be used for the contacts 230, 231. In particular, one of the contacts 230, 231 may be a standard alloy as is generally used for conducting layers on VCSEL devices. The other contact may then be made from a material providing a high transition resistance to the underlying layer of the mesa.

Figure 6:
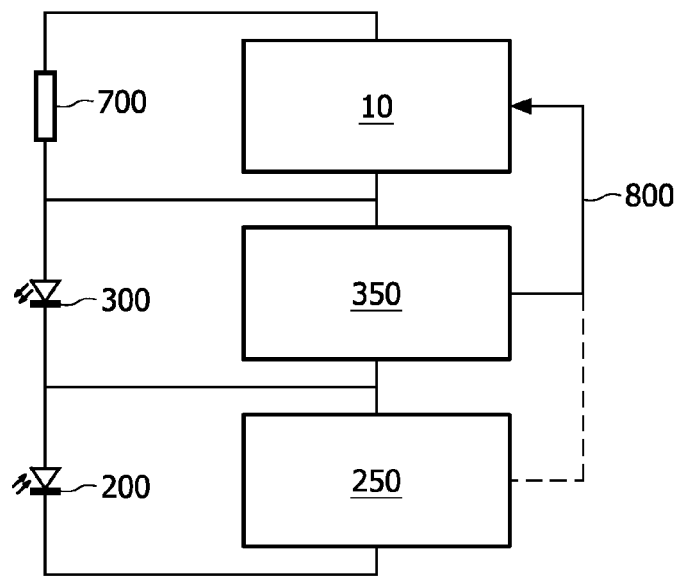
FIG. 6 is a block diagram of an embodiment of the control circuitry for the semiconductor laser diode and integrated photodiode.

In the embodiments described hereinbefore, the feedback control circuitry 10 is shown as a standalone part. However, the feedback control circuitry 10 may be embedded and/or integrated in the driving circuitry of the semiconductor laser device 1. The block diagram of FIG. 6 shows an embodiment of the driver circuitry including the feedback control circuitry 10. This set-up is particularly usable for laser diode elements with electric contacts modified as electric heating elements, i.e. the laser diode elements as shown in FIGS. 3 to 5.

The current through the VCSEL 300 is controlled by laser driver 350, which also measures the laser voltage (indication for temperature). The reverse voltage on the integrated photodiode 200 as well as the photocurrent is controlled in photodiode control circuit 250. The heating element 700, for instance, a modified electric contact as shown in FIGS. 3 to 5 can be independently controlled by the feedback control circuitry 10. The feedback loop 800 takes information about the laser voltage and, if desired, also about the photocurrent, as indicated by the broken line.

In the embodiment shown in FIGS. 1 and 2, the heating can be influenced via the reverse voltage on the photodiode (e.g. device 250). In this embodiment, the feedback control circuitry 10 may thus also be integrated in photodiode control circuit 250.

Figure 7:
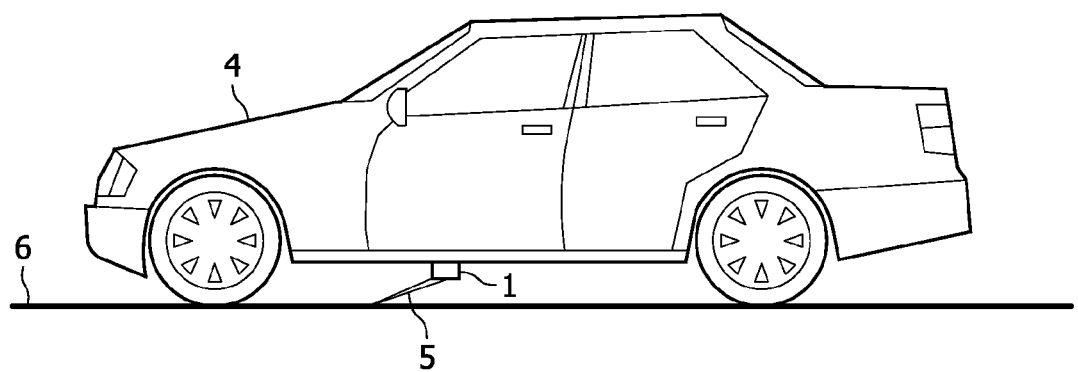
FIG. 7 shows an application of a semiconductor laser device 1.

FIG. 7 shows an application of a semiconductor laser device 1. The semiconductor laser device 1 is used as a vehicle velocity sensor, specifically to measure the speed of a car 4. The semiconductor laser device 1 is mounted under the car 4. The speed is measured by evaluating self-mixing effects such as self-mixing oscillations and/or the speckle effect. For a measurement of the speed by Doppler-induced self-mixing oscillations of the laser intensity, the device 1 is arranged in such a way that the laser beam 5 hits the pavement 6 at an oblique angle. In order to stabilize the laser wavelength under the strongly varying ambient temperatures, the feedback control circuitry stabilizes the temperature of the VCSEL at a value of between 50° C. and 80° C. Consequently, no cooling, in particular no active cooling is required to ensure a stable wavelength within a large range of ambient temperatures, as the laser diode of the semiconductor laser device 1 is always operated in the upper range of the temperatures occurring under ambient conditions typical of a car. However, to avoid performance losses and a decrease of lifetime, the temperature control circuitry preferably stabilizes the temperature of the VCSEL at a value of not more than 180° C., more preferably not more than 120° C. For this embodiment of the invention, other types of semiconductor laser devices comprising heating elements may generally be employed as well. For example, instead of using one of the components of the laser diode and the monitoring diode, an additional heating element may be arranged on the substrate of the laser diode.

Although preferred embodiments of the present invention have been illustrated in the accompanying drawings and described in the foregoing description, it will be understood that the invention is not limited to the embodiments disclosed and that numerous modifications can be conceived without departing from the scope of the invention as set out in the appending claims.

LIST OF REFERENCE SIGNS

1: Semiconductor laser device
3: Laser diode device
4: Car
5: Laser beam
6: Pavement
10: Feedback control circuit
12, 14, 16: Lines
18, 19: Terminal points
100: Substrate
110, 210, 310,
230, 231: Electric contacts
200: Integrated photodiode
250: Photodiode control circuit
300: VCSEL
301, 303: Bragg reflector
302: Quantum well
350: Laser driver
600: Trench
700: Heating element
800: Feedback loop

The invention claimed is:

1. A semiconductor laser device comprising
a laser diode device with
a semiconductor laser diode,
an integrated photodiode and
electric contacts for electrically connecting said semiconductor laser diode and said integrated photodiode, said semiconductor laser device further comprising
feedback control circuitry for setting or stabilizing a laser wavelength by stabilizing or setting a temperature of the laser diode device, said feedback control circuitry being set up to generate a heating voltage or current in response to a measured temperature-dependent parameter,
said heating voltage or current being applied to electric contacts of said laser diode device, of which at least one also electrically connects said semiconductor laser diode or said integrated photodiode so that said heating current flows through the laser diode device and heats said semiconductor laser diode.

2. The semiconductor laser device according to claim 1, wherein said laser diode device comprises a vertical cavity surface emitting laser with said integrated photodiode.

3. The semiconductor laser device according to claim 1, wherein said integrated photodiode is operated at reverse bias, and said feedback control circuitry for stabilizing or setting the temperature of the laser diode device is set up to set the voltage across the integrated photodiode which is thereby heated by a photocurrent induced by a received light.

4. The semiconductor laser device according to claim 1, wherein at least one of said electric contacts for electrically connecting the semiconductor laser diode and the integrated photodiode has two terminal points connecting to said feedback control circuitry, wherein said heating current flows between said two terminal points.

5. The semiconductor laser device according to claim 1, wherein the heating current or voltage is fed between two laterally separated electric contacts on a common surface, at least one of the electric contacts contacting said semiconductor laser diode or said integrated photodiode.

6. The semiconductor laser device according to claim 5, wherein said separated electric contacts are made from different materials.

7. The semiconductor laser device according to claim 1, wherein the input of the feedback control circuitry is connected to the electric contacts of said semiconductor laser diode, which feedback control circuitry measures a forward voltage of the laser diode.

8. The semiconductor laser device according to claim 7, wherein said semiconductor laser diode is heated by the feedback control circuitry as long as the operating voltage comes below a predefined value at a fixed operating current if the laser diode temperature is lower than a temperature corresponding to a predetermined wavelength.

9. The semiconductor laser device according to claim 1, wherein the feedback control circuitry measures a parameter corresponding to a resistance of a part heated by said heating current or voltage.

10. The semiconductor laser device according to claim 1, wherein the input of the feedback control circuitry is connected to the electric contacts of said integrated photodiode, and the light output as measured by the integrated photodiode is fed as an input parameter to the feedback control circuitry which sets the heating current or voltage in dependence upon the light output.

11. The semiconductor laser device according to claim 1, wherein the semiconductor laser diode is formed as a mesa structure on a substrate, which said mesa structure is at least partly surrounded by a trench in said substrate.

12. The semiconductor laser device according to claim 1, wherein the semiconductor laser diode is formed as a mesa structure on a substrate, wherein a partially oxidized layer is arranged between said mesa and said substrate.

* * * * *